(12) United States Patent
Brew et al.

(10) Patent No.: US 11,697,873 B2
(45) Date of Patent: Jul. 11, 2023

(54) SYSTEM AND METHOD FOR VAPOR DEPOSITION COATING OF EXTRUSION DIES USING IMPEDANCE DISKS

(71) Applicant: CORNING INCORPORATED, Corning, NY (US)

(72) Inventors: Thomas William Brew, Corning, NY (US); Yuehao Li, Painted Post, NY (US); Min Shen, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/414,569

(22) PCT Filed: Dec. 13, 2019

(86) PCT No.: PCT/US2019/066137
§ 371 (c)(1),
(2) Date: Jun. 16, 2021

(87) PCT Pub. No.: WO2020/139580
PCT Pub. Date: Jul. 2, 2020

(65) Prior Publication Data
US 2022/0056579 A1 Feb. 24, 2022

Related U.S. Application Data

(60) Provisional application No. 62/785,766, filed on Dec. 28, 2018.

(51) Int. Cl.
*C23C 16/04* (2006.01)
*C23C 16/34* (2006.01)
(Continued)

(52) U.S. Cl.
CPC ............ *C23C 16/045* (2013.01); *C23C 16/34* (2013.01); *C23C 16/36* (2013.01); *C23C 16/45502* (2013.01); *C23C 16/45565* (2013.01)

(58) Field of Classification Search
None
See application file for complete search history.

(56) References Cited

U.S. PATENT DOCUMENTS 5,256,449 A * 10/1993 Suzuki ................. C23C 16/045
427/237
5,858,463 A 1/1999 Ogura et al.
(Continued)

FOREIGN PATENT DOCUMENTS

CN 1989587 A 6/2007
CN 101319309 A 12/2008
(Continued)

OTHER PUBLICATIONS

International Search Report and Written Opinion of the International Searching Authority; PCT/US2019/066137; dated Apr. 17, 2020, 10 pages; European Patent Office.
(Continued)

*Primary Examiner* — Jose I Hernandez-Kenney
(74) *Attorney, Agent, or Firm* — Joseph M. Homa

(57) ABSTRACT

Methods of depositing an inorganic material on an extrusion die including positioning an extrusion die within a vapor deposition chamber, positioning an impedance disk over a face of the extrusion die, the impedance disk having a plurality of through holes and the face of the extrusion die having a plurality of slots defined by a plurality of extrusion die pins, and flowing one or more deposition gases through the plurality of through holes and into the plurality of slots to deposit inorganic particles on side walls of the plurality of pins. The total impedance to the flow of the deposition gases across the impedance disk and the extrusion die may be equal to a disk impedance of the impedance disk plus a die
(Continued)

impedance of the extrusion die, and the disk impedance may be at least 40% of the total impedance to the flow of the deposition gases.

19 Claims, 9 Drawing Sheets

(51) Int. Cl.
*C23C 16/36* (2006.01)
*C23C 16/455* (2006.01)

(56) References Cited

U.S. PATENT DOCUMENTS

| | | | |
|---|---|---|---|
| 5,952,079 A | 9/1999 | Andou et al. | |
| 6,413,072 B1 | 7/2002 | Brew et al. | |
| 7,303,782 B2 | 12/2007 | Avery et al. | |
| 2005/0263248 A1 | 12/2005 | Rocha-Alvarez et al. | |
| 2006/0115592 A1* | 6/2006 | Avery | B29C 48/11 427/248.1 |
| 2006/0178769 A1* | 8/2006 | Brew | B29C 48/251 700/196 |
| 2008/0302303 A1 | 12/2008 | Choi et al. | |
| 2011/0023775 A1 | 2/2011 | Nunes et al. | |
| 2011/0124204 A1* | 5/2011 | Ota | H01L 21/31641 118/724 |
| 2014/0147590 A1* | 5/2014 | Maier | C23C 16/36 427/250 |
| 2018/0001511 A1* | 1/2018 | Vaidyanathan | B28B 3/269 |

FOREIGN PATENT DOCUMENTS

| | | |
|---|---|---|
| CN | 102471887 A | 5/2012 |
| EP | 0674018 A1 | 9/1995 |
| EP | 0882557 A1 | 12/1998 |

OTHER PUBLICATIONS

Chinese Patent Application No. 201980086907.5, Office Action dated Feb. 21, 2023, 5 pages (English Translation only), Chinese Patent Office.

* cited by examiner

SYSTEM AND METHOD FOR VAPOR DEPOSITION COATING OF EXTRUSION DIES USING IMPEDANCE DISKS

This is a national stage application under 35 U.S.C. § 371 of International Application No. PCT/US2019/066137, filed on Dec. 13, 2019, which claims the benefit of priority under 35 U.S.C. § 119 of U.S. Provisional Application No. 62/785,766 filed on Dec. 28, 2018 the content of which is incorporated herein by reference in its entirety.

FIELD

The present disclosure relates to impedance disks for use in vapor deposition systems. In particular, the present disclosure relates to impedance disks that control the flow of deposition gases during vapor deposition coating of honeycomb extrusion dies.

BACKGROUND

Extrusion dies are useful in forming a variety of articles such as cellular or honeycomb ceramic bodies.

BRIEF SUMMARY

The present disclosure is directed to impedance disks having features (e.g., through holes) that cause a pressure drop in a flow of gas through or past the impedance disk, for use in vapor deposition processes, for example chemical vapor deposition processes. The impedance disks can facilitate the application of a uniform coating layer on an extrusion die, for example a honeycomb extrusion die, by controlling the pressure of one or more deposition gases on opposite sides of the impedance disk. The impedance disks can comprise a plurality of through holes having an average effective diameter selected such that a disk impedance of the impedance disk is approximately equal to a die impedance of an extrusion die.

Some embodiments are directed to a method of depositing an inorganic material on an extrusion die, the method comprising positioning an extrusion die within a vapor deposition chamber, positioning an impedance disk over a face of the extrusion die, the impedance disk having a plurality of through holes and the face of the extrusion die having a plurality of slots defined by a plurality of extrusion die pins, and flowing one or more deposition gases through the plurality of through holes and into the plurality of slots to deposit inorganic particles on side walls of the plurality of pins. Where a total impedance to the flow of the one or more deposition gases across the impedance disk and the extrusion die is equal to a disk impedance of the impedance disk plus a die impedance of the extrusion die, and where the disk impedance is at least 40% of the total impedance to the flow of the one or more deposition gases.

In some embodiments, the method according to embodiments of the preceding paragraph comprises a disk impedance that is at least 50% of the total impedance to the flow of the one or more deposition gases.

In some embodiments, the method according to embodiments of any of the preceding paragraphs comprises a disk impedance that is 40% to 60% of the total impedance to the flow of the one or more deposition gases.

In some embodiments, the method according to embodiments of any of the preceding paragraphs comprises a disk impedance that is 65% to 150% of the die impedance.

In some embodiments, the method according to embodiments of any of the preceding paragraphs comprises a disk impedance is 90% to 150% of the die impedance.

In some embodiments, the impedance disk according to embodiments of any of the preceding paragraphs is disposed between an inlet for the one or more deposition gases and the face of the extrusion die.

In some embodiments, the method according to embodiments of any of the preceding paragraphs comprises an impedance disk with through holes having an average effective diameter, where the average effective diameter sets the disk impedance to be at least 40% of the total impedance to the flow of the one or more deposition gases. In some embodiments, the average effective diameter of the through holes is in the range of 0.007 inches to 0.04 inches. In some embodiments, the average effective diameter of the through holes is in the range of 0.02 inches to 0.03 inches.

In some embodiments, the method according to embodiments of any of the preceding paragraphs comprises an extrusion die that comprises a plurality of feed holes, where the pins of the extrusion die are disposed between the feed holes and the impedance disk. In some embodiments, the feed holes have an average effective diameter in the range of 0.03 inches to 0.07 inches. In some embodiments, the through holes have a center-to-center lateral spacing and the feed holes have a center-to-center lateral spacing, where the center-to-center lateral spacing of the through holes is within 60% of the center-to-center lateral spacing of the feed holes. In some embodiments, the through holes have a center-to-center lateral spacing and the feed holes have a center-to-center lateral spacing, where the center-to-canter lateral spacing of the through holes is within 10% of the center-to center lateral spacing of the feed holes. In some embodiments, the center-to-center lateral spacing of the through holes is within the range of 0.04 inches to 0.06 inches.

In some embodiments, the method according to embodiments of any of the preceding paragraphs comprises a vapor deposition chamber with a chamber wall surrounding the extrusion die, where the chamber wall has a minimum internal cross-sectional dimension measured perpendicular to the flow of the one or more deposition gases within the chamber and the extrusion die has an effective diameter equal to at least 70% of the minimum internal cross-sectional chamber dimension.

In some embodiments, the method according to embodiments of any of the preceding paragraphs comprises an extrusion die having a maximum outer dimension that is at least 70% of a minimum internal cross-sectional dimension of the vapor deposition chamber.

In some embodiments, the method according embodiments of any of the preceding paragraphs comprises depositing inorganic particles that comprise at least one of: boron-doped titanium carbonitride, titanium carbonitride, or titanium nitride.

In some embodiments, the method according to embodiments of any of the preceding paragraphs comprises an extrusion die that comprises stainless steel.

In some embodiments, the method according to embodiments of any of the preceding paragraphs comprises an extrusion die that has a honeycomb geometry.

In some embodiments, the method according to embodiments of any of the preceding paragraphs comprises a deposition chamber that is a chemical vapor deposition chamber.

Some embodiments are directed to a method of depositing an inorganic material on an extrusion die comprising a plurality of feed holes and a face comprising a plurality of slots defined by a plurality of extrusion die pins, the method comprising flowing one or more deposition gases through a plurality of through holes of an impedance disk located in the vapor deposition chamber upstream of the extrusion die and into the plurality of slots to deposit inorganic particles on side walls of the plurality of pins, where an effective diameter of the extrusion die is at least 70% of a minimum internal cross-sectional chamber dimension of the vapor deposition chamber, where the through holes have a center-to-center lateral spacing, the feed holes have a center-to-center lateral spacing, and the center-to-center lateral spacing of the through holes is within 10% of the center-to-center lateral spacing of the feed holes, and where a total impedance to the flow of the one or more deposition gases across the impedance disk and the extrusion die is equal to a disk impedance of the impedance disk plus a die impedance of the extrusion die, and the disk impedance is at least 40% of the total impedance to the flow of the one or more deposition gases.

In some embodiments, the method according to embodiments of the preceding paragraph comprises an extrusion die that has a honeycomb geometry.

Some embodiments are directed to a vapor deposition system comprising a vapor deposition chamber having a chamber wall, an extrusion die disposed within the vapor deposition chamber and surrounded by the chamber wall, where the extrusion die comprises: an effective diameter of at least 70% of a minimum internal cross-sectional chamber dimension of the chamber wall, a face having a plurality of slots defined by a plurality of extrusion die pins, and a plurality of feed holes. The vapor deposition assembly further comprising an impedance disk disposed within the vapor deposition chamber and positioned over the face of the extrusion die, the impedance disk comprising a plurality of through holes, where the through holes have an average effective diameter configured to cause a pressure of one or more deposition gases to decrease by at least 40% of a total impedance to the flow of the one or more deposition gases across the impedance disk and the pins of the extrusion die.

In some embodiments, the extrusion die according to embodiments of the preceding paragraph has a honeycomb geometry.

In some embodiments, the extrusion die according to embodiments of either of the two preceding paragraphs comprises through holes with a center-to-center lateral spacing and feed holes with a center-to-center lateral spacing, and the center-to-center lateral spacing of the through holes is within 10% of the center-to-center lateral spacing of the feed holes.

In some embodiments, the system according to embodiments of any of the preceding paragraphs comprises a disk impedance that is 65% to 150% of the die impedance.

In some embodiments, the system according to embodiments of any of the preceding paragraphs comprises a disk impedance is 90% to 150% of the die impedance.

BRIEF DESCRIPTION OF THE DRAWINGS

The accompanying figures, which are incorporated herein, form part of the specification and illustrate embodiments of the present disclosure. Together with the description, the figures further serve to explain the principles of and to enable a person skilled in the relevant art(s) to make and use the disclosed embodiments. These figures are intended to be illustrative, not limiting. Although the disclosure is generally described in the context of these embodiments, it should be understood that it is not intended to limit the scope of the disclosure to these particular embodiments. In the drawings, like reference numbers indicate identical or functionally similar elements.

DETAILED DESCRIPTION

Figure 1:
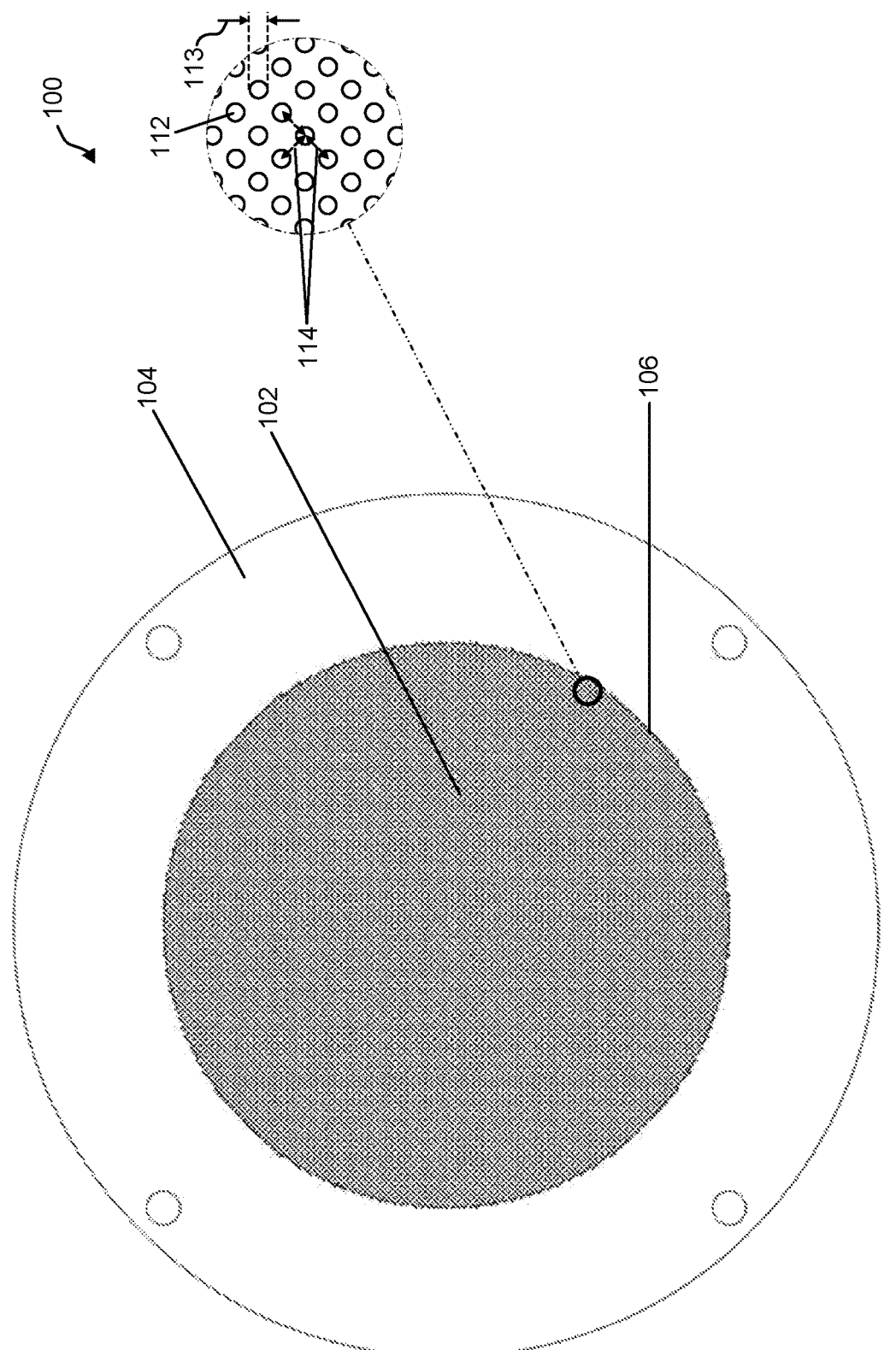
FIG. 1 illustrates an impedance disk according to some embodiments.

The following examples are illustrative, but not limiting, of the present disclosure. Other suitable modifications and adaptations of the variety of conditions and parameters normally encountered in the field, and which would be apparent to those skilled in the art, are within the spirit and scope of the disclosure.

The manufacture of extrusion dies, for example as honeycomb extrusion dies, may include a coating step for wear protection that serves to extend the life of the dies. Wear-resistant coatings may also help control and maintain the dimensions of the features of a die (and thus the dimensional accuracy of the extrudate formed by the die), such as the slot width between adjacent pins of a honeycomb extrusion die.

Vapor deposition coating processes, for example chemical vapor deposition (CVD) coating processes, can be used to form an inorganic protective layer on a metal substrate, for example an extrusion die. As described herein, inorganic particles are deposited on extrusion die surfaces (e.g., surfaces defining feedholes or slots) to reduce wear, maintain dimensional accuracy, and extend the life of an extrusion die. In extrusion dies configured to produce articles with honeycomb geometries, coating layers formed using vapor deposition may also serve to decrease the size or dimensions (width) of extrusion die slots, e.g., to achieve thinner than uncoated ("as-cut") slot dimensions.

Inorganic particles can be deposited to improve the wear resistance of a tool (e.g., an extrusion die). The particles can be deposited to form an abrasion-resistant coating over a surface of the tool. As used herein, "particles" deposited during a deposition process can be formed in bulk within a deposition chamber, formed directly on a surface within the deposition chamber (e.g., directly on a target substrate), or a combination thereof. Particles deposited in bulk are formed within the deposition chamber via reactions between vapor molecules, and after formation, these particles deposit on a surface. Particles formed directly on a surface are formed via the reaction of vapor molecules on a surface within the deposition chamber. Particles can be deposited on a surface to form a continuous or discontinuous film, layer, or coating of material on the surface.

To obtain one or more desired slot widths for a honeycomb extrusion die, an impedance disk can be used. An impedance disk is a perforated disk having plurality of through holes having a particular effective diameter. In some embodiments disclosed herein, the impedance disk has equally sized through holes. In some embodiments, the impedance disk is made from a thin stainless steel disk, for example a thin 410 series stainless steel plate, although other materials are possible, particularly those that can withstand the conditions (e.g., high temperature, etc.) of the selected deposition process.

In some cases, a "neutral" impedance disk is used. A neutral impedance disk is an impedance disk having approximately the same effective diameter as the effective diameter of an extrusion die it is designed to be used with. In some embodiments, an impedance disk having an effective diameter larger or smaller than the effective diameter of an extrusion die is used. It is to be appreciated that the term "effective diameter" is utilized herein with respect to the size of various components or features (such as impedance disks, extrusion dies, through holes, etc.), but that this term should not be interpreted as requiring the corresponding component or feature to have a circular shape. Instead, these components and features can take non-circular shapes, and in such embodiments the term "effective diameter" is intended to refer to the maximum outer cross-sectional dimension of the shape. For example, the "effective diameter" of an extrusion die, impedance disk, or through hole having a square cross-sectional shape would be the diagonal dimension across the face of the square.

Impedance disks as disclosed herein can be used to control deposition gas pressures within a vapor deposition chamber, and thus control coating thicknesses of inorganic material(s) coated on an extrusion die within the vapor deposition chamber. Undesirable deposition gas pressures and coating thickness can be caused by for example, interaction between certain materials, such as graphite tooling and an extrusion die, interaction between a vapor deposition chamber wall and an extrusion die, or temperature variations within a vapor deposition chamber (e.g., undesirable temperature variation within the extrusion die itself).

Impedance disks described herein can be used to control the coating thickness of inorganic particles on side walls of extrusion die pins, i.e., within extrusion die slots defined by the extrusion pins. As such, the impedance disks described herein can be utilized to achieve one or more desired slot widths after coating. This control is due to the size(s) of the through holes in the impedance disks that impact the concentration of one or more deposition gases (i.e., species concentration) flowed through an extrusion die. In some cases, a species concentration relationship can be developed, e.g., through modeling and/or experimental runs of various impedance disk hole sizes, to provide a coating having a desired thickness and thickness uniformity on side walls of extrusion die pins. In some cases, the minimum hole size can be chosen empirically based on estimated coating rates for different die designs. Such an empirical relationship has proved to be independent of the extrusion die type when the outer effective diameter of the die is significantly smaller than the relevant inner dimension (e.g., effective diameter) of a vapor deposition chamber (e.g., referred to herein and defined below as the "minimum internal cross-sectional dimension").

For example, the empirical species concentration technique described above can be applied to vapor deposition coating processes for extrusion dies having a relatively small outer die effective diameter in comparison to the dimensions of the deposition chamber. For example, a die having an outer effective diameter of less than or equal to 9.25 inches in a deposition chamber having an effective diameter of about 18-20 inches. However, larger effective diameter dies, for example, may suffer from non-uniform coating thickness patterns when coated in a deposition chamber having a similar effective diameter (e.g., an 18-inch effective diameter die in an 18-20 inch effective diameter deposition chamber), which can result in undesirable extrusion die slot widths. This reduces the performance of products extruded from these larger effective diameter dies. Since larger effective diameter dies (e.g., a die having an 18 inch die effective diameter in an approximately 18-20 inch effective diameter deposition chamber) may be very close to the internal chamber dimension of the vapor deposition chamber, the walls of the vapor deposition chamber can have a strong effect on coating thickness patterns.

The effect from the walls of the vapor deposition chamber being significantly close to the outer edge of the extrusion die being coated (referred to herein as "boundary layer effect") can create significant coating thickness variability on an extrusion die. In general, and without wishing to be bound by theory, the boundary layer effect results in the flow field of one or more deposition gases in regions proximate to the walls of the deposition chamber controlling the amount of coating material deposited on a substrate as opposed to the deposition of the coating material being controlled as a function of the concentration of the one or more deposition gases in the chamber. In other words, and again without wishing to be bound by theory, the boundary layer effect near the wall of a vapor deposition chamber may impact the desired uniform flow of vapor deposition gas(es) through an extrusion die. This is undesirable because it significantly reduces the uniformity of the thickness a coating formed by deposition of the inorganic particles. That is, such non-uniform flow resulting from boundary layer effects can cause unwanted coating thickness variability, and accordingly, unwanted coated slot width variability for an extrusion die.

Reducing dimensional variability of components of an individual die, and between multiple different dies, is one consideration for producing dimensionally consistent articles (e.g., ceramic honeycomb structures) from that die or series of multiple dies. Existing vapor deposition designs and methods may not reliably yield desired and uniform coating thickness on an extrusion die. For dies similar in size to the internal dimensions of the deposition chamber, in particular, the boundary layer effect can dominate the flow profile of deposition gas(es) (i.e., the gas flow field and/or flow rate of the gas(es) at different locations in the deposition chamber), resulting in non-uniform center to outer coating thicknesses and thus non-uniform extrusion die slot widths for an individual extrusion die and between different dies. Advantageously, impedance disks as discussed herein impart an impedance that is at least a threshold percentage of the total system impedance in order to reduce or dampen boundary layer gas flow effects before the gas enters the die. In this way, the currently disclosed systems and methods can be used to produce more uniform coating thickness across the entire width of a die, even in situations in which the outer dimensions (e.g., effective diameter) of the die approach the inner dimensions (e.g., effective diameter) of the deposition chamber.

The methods, systems, and impedance disks as discussed herein can mitigate the above-noted unwanted variability in coating thickness. Impedance disks discussed herein are designed to control the gas flow field such that the disk impedance of the impedance disk is the same or similar to the die impedance of an extrusion die within a vapor deposition chamber. By creating a disk impedance that is similar to a die impedance, substantially uniform flow of one or more deposition gases through an extrusion die can be achieved. In one embodiment, for a deposition system having a total impedance defined as the sum of a disk impedance and a die impedance, the disk impedance is at least 40% of the total impedance of the system.

The impedance disks and disk design methodology discussed herein utilize the impedance of an impedance disk to rectify and overcome gas flow field irregularities (e.g., caused by boundary layer effects as discussed above). Impedance disks and the methods discussed herein address coating thickness distribution (or variability) problems as described above. In particular, the impedance disks and methods discussed herein address coating thickness distribution problems as described above for extrusion dies having effective diameters similar to the internal chamber dimension of a vapor deposition chamber. Impedance disks and methods discussed herein can be used to dampen (reduce) the boundary layer gas flow effects thereby rectifying the flow field of one or more deposition gases before the gas(es) enter the slots of an extrusion die. In some embodiments, a disk impedance is equal to or higher than a certain percentage of the total system impedance.

As used herein, a "total system impedance" or "total impedance" (corresponding to a "total change in pressure") means the sum of the airflow impedances of the relevant components of the system. For example, if a system has an extrusion die and an impedance disk, the total system impedance is the sum of a disk impedance of an impedance disk and a die impedance of an extrusion die. The total impedance of the system corresponds to a total change in pressure through the system (e.g., a first pressure drop across the impedance disk due to the disk impedance and a second pressure drop across the extrusion die due to the die impedance). Accordingly, as used herein, a "disk impedance" means the impedance of the impedance disk that results in a drop in pressure of one or more deposition gases that occurs when the gas(es) flow through the through-holes of the impedance disk. Accordingly, as used herein, a "die impedance" means the impedance of the extrusion die that results in a drop in pressure of one or more deposition gases that occurs when the gas(es) flow through the openings (e.g., feed holes and slots) of an extrusion die.

Deposition gases include (i) source gases for one or more elements of an inorganic particle or coating discussed herein and (ii) carrier gases for the source gases. Exemplary source gases include, but are not limited to, titanium tetrachloride ($TiCl_4$) tetrakis(dimethylamido) titanium (TDMAT), borane, diborane, boron trichloride, trimethylamine borane (($CH_3$)$_3NBH_3$) (TMAB), or a combination thereof. An exemplary carrier gas is hydrogen ($H_2$). Inorganic particles discussed herein include at least one of: boron-doped titanium carbonitride, titanium carbonitride, or titanium nitride.

In addition or alternatively to experimental trials, computational fluid dynamics modeling can be utilized to define the impedance disk hole effective diameter needed to control the flow and pressure of the deposition gas(es) to achieve the desired coating thickness and/or desired slot width(s). Techniques described herein are die-dependent because the die impedance impacts the total system impedance. This allows the techniques described herein to be applied to extrusion dies and vapor deposition chambers of various sizes. Tests of the impedance disks and methodologies discussed herein show a significant improvement in the coating thickness variability (that is, a reduction in the variability of the coating thickness across the width of a die), and accordingly, slot width variability, in comparison to conventional techniques.

FIG. 1 illustrates an impedance disk 100 according to some embodiments. Impedance disk 100 comprises a perforated central portion 102 and a solid rim portion 104 disposed around an edge 106 of central portion 102. Within central portion 102 are a plurality of through holes 112, shown in detail in an enlarged section of central portion 102. In some embodiments, all through holes 112 have the same effective diameter 113. In some embodiments, through holes 112 have varying effective diameters 113. The effective diameter(s) of through holes 112 can be selected to produce a desired disk impedance as described herein.

In some embodiments, the effective diameter of through holes 112 is in the range of 0.007 to 0.04 inches including subranges. Since there are many through holes 112, the value for the effective diameter may be provided herein as an "average effective diameter", i.e., the average value for the effective diameters of all through holes 112. For example, in some embodiments, the average effective diameter of the through holes is 0.007 inches, 0.01 inches, 0.02 inches, 0.03 inches, or 0.04 inches, or within a range having any two of these values as endpoints. In some embodiments, the average effective diameter of through holes 112 is selected such that the disk impedance of impedance disk 100 is at least 40% of the total impedance of the system to the flow of one or more deposition gases used to coat inorganic particles on an extrusion die during a vapor deposition process. In some embodiments, the average effective diameter of through holes 112 is selected such that the disk impedance is at least 50% of the total impedance to the flow of one or more deposition gases used to coat inorganic particles on an extrusion die during a vapor deposition process. In some embodiments, the average effective diameter of through holes 112 is selected such that the disk impedance is at least 60% of the total impedance to the flow of one or more deposition gases used to coat inorganic particles on an extrusion die during a vapor deposition process.

In some embodiments, regardless of the effective diameters of through holes 112, the center-to-center lateral spacing 114 between each through hole 112 is constant in central portion 102. As used herein "center to center lateral spacing" is a term that describes the spacing between a plurality of holes arranged in a pattern. "Center-to-center lateral spacing" means the distance, in a straight line, between the geometrical center of a hole and the geometrical center of that hole's closest neighbors in the pattern of holes. For the purpose of measuring a center-to-center lateral spacing of a hole pattern, through holes 112 within two lateral spacings of an edge of the pattern (e.g., edge 106 of central portion 102) are excluded because they are not be surrounded on all sides by neighboring holes.

Figure 2:
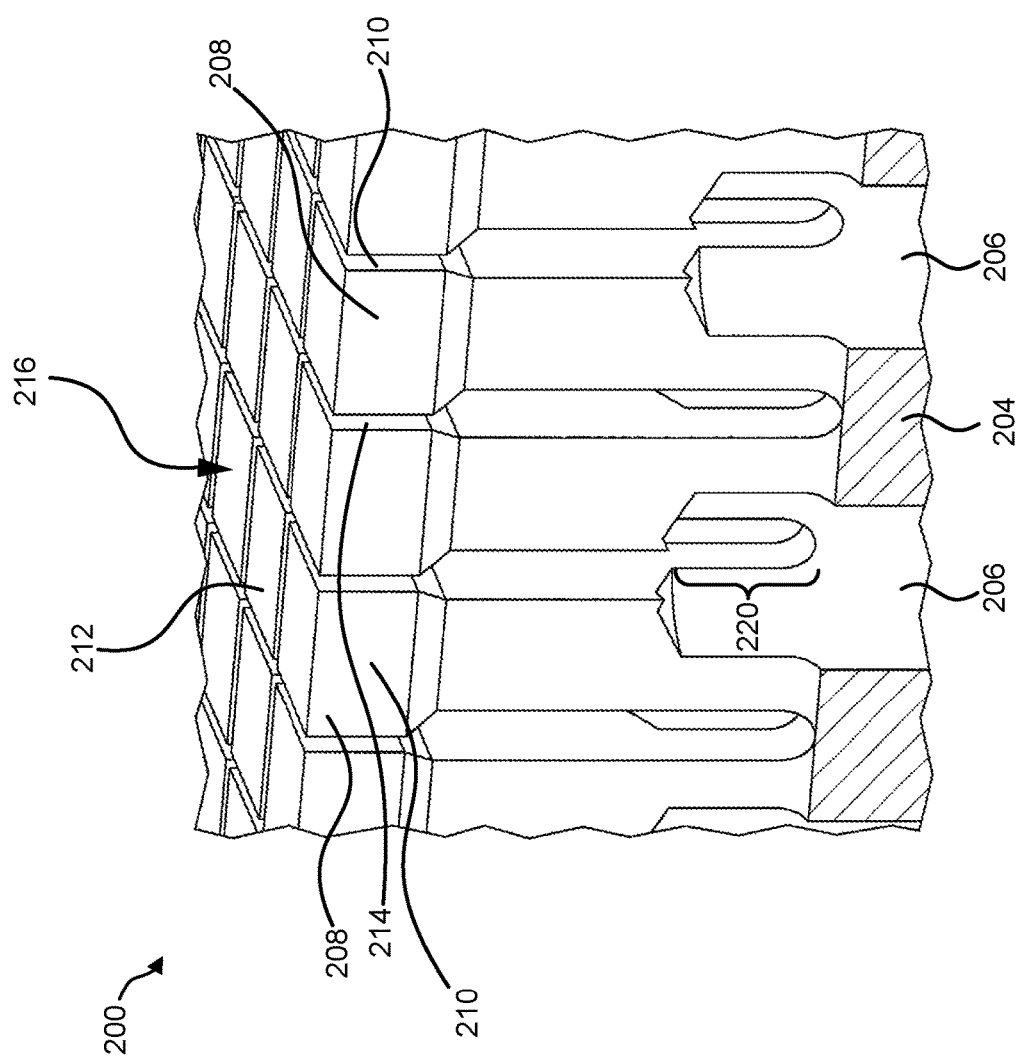
FIG. 2 illustrates a portion of an extrusion die according to some embodiments.
Figure 3:
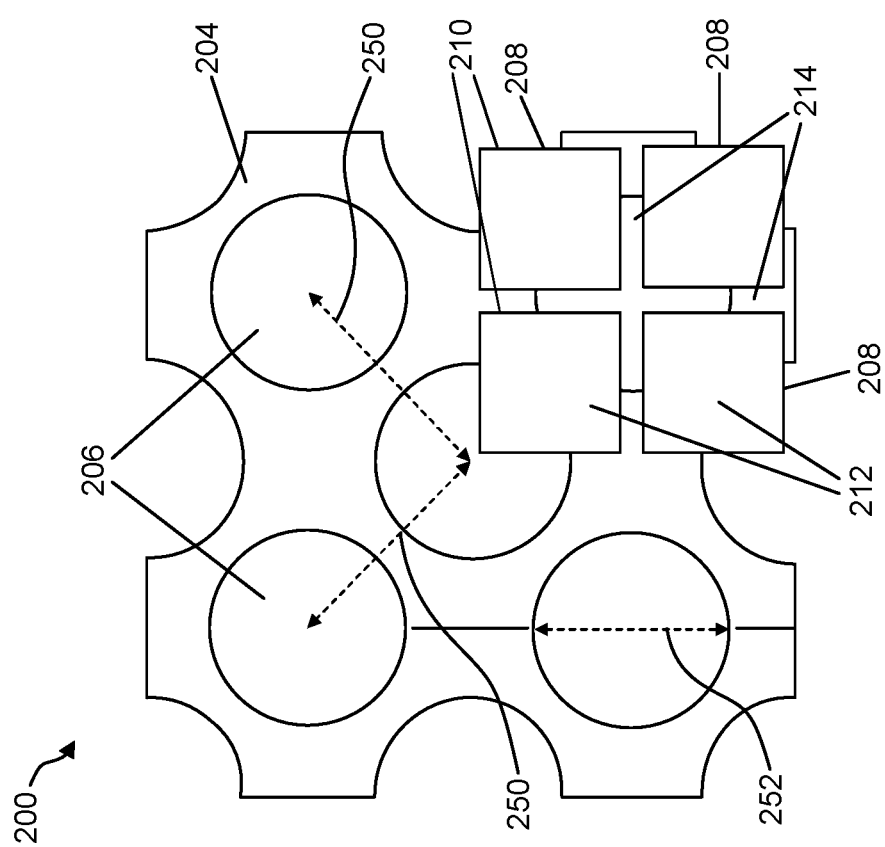
FIG. 3 illustrates a top plan view of an extrusion die according to some embodiments, with some pins of the extrusion die not shown for clarity of other features.

In some embodiments, center-to-center lateral spacing 114 corresponds to a center-to-center lateral spacing of feed holes of an extrusion die (e.g., center-to center lateral spacing 250 of feed holes 206 of extrusion die 200 of FIGS. 2-3) that impedance disk 100 is designed to be used with. In some embodiments, center-to-center lateral spacing 114 is within 60% of the center-to-center lateral spacing of the feed holes of an extrusion die. In some embodiments, center-to-center lateral spacing 114 is within 50% of the center-to-center lateral spacing of the feed holes of an extrusion die.

In some embodiments, center-to-center lateral spacing 114 is within 40% of the center-to-center lateral spacing of the feed holes of an extrusion die. In some embodiments, center-to-center lateral spacing 114 is within 30% of the center-to-center lateral spacing of the feed holes of an extrusion die. In some embodiments, center-to-center lateral spacing 114 is within 20% of the center-to-center lateral spacing of the feed holes of an extrusion die. In some embodiments, center-to-center lateral spacing 114 is within 10% of the center-to-center lateral spacing of the feed holes of an extrusion die.

In some embodiments, center-to-center lateral spacing 114 is within the range of 0.04 inches to 0.06 inches, including subranges. For example, in some embodiments, center-to-center lateral spacing 114 is 0.04 inches, 0.045 inches, 0.05 inches, 0.055 inches, or 0.60 inches, or within a range having any two of these values as endpoints.

FIGS. 2-3 illustrate an exemplary extrusion die 200. Extrusion die 200 comprises a die body 204 provided with a plurality of feed holes 206 and an array of pins 208. Exterior surfaces (side walls) 210 of pins define a criss-crossing or intersecting array of discharge slots 214. Surfaces 210 of pins 208 can be uncoated prior to deposition of inorganic particles or can comprise a pre-existing coating deposited prior to deposition of additional organic particles. A discharge face 216 of extrusion die 200 is formed by end surfaces 212 of pins 208 and corresponding openings of discharge slots 214 formed between side surfaces 210 of pins 208. In the illustrated embodiments, extrusion die 200 is a honeycomb extrusion die. In some embodiments, feed holes 206 and slots 214 can be cut to respective depths such that the slots 214 overlap the feedholes 206 at an overlap region 220. Overlap regions 220 may facilitate the flow of a batch material from feed holes 206 through the slots 214 during an extrusion process As shown in FIG. 3 (in which some of pins 208 are not illustrated for increased clarity of features of feedholes 206), feed holes 206 have an average effective diameter defined by the effective diameter 252 of each feedhole 206. Feedholes 250 are spaced by a center-to-center lateral spacing 250, which can correspond to the distance of center-to-center lateral spacing 114 of through holes 112 of impedance disk 100. In some embodiments, feed holes 206 have an average effective diameter in the range of 0.03 inches to 0.07 inches, including subranges. For example, in some embodiments, feed holes 206 have an average effective diameter of 0.03 inches, 0.035 inches, 0.039 inches, 0.04 inches, 0.045 inches, 0.05 inches, 0.055 inches, 0.06 inches, 0.065 inches, or 0.07 inches, or an average effective diameter within a range having any two of these values as endpoints.

In some embodiments, pins 208 are fabricated from as a unitary element of extrusion die 200, either as part of die body 204 or as a composite die discharge section connected with die body 204 by a metal-to-metal bond. If not formed as a unitary body, any bonding together of the various die elements can be carried out in any manner known or discovered in the art. For example, soldering, brazing, and diffusion bonding techniques are known for use in the assembly of the laminated extrusion dies. The use of unitary die structures is particularly well suited to the production of dies in which bonding of the pins to a support layer would be difficult (e.g., such as for relatively smaller sized pins).

The extrusion die 200 can be manufactured from any material known or discovered in the art. Examples of materials suitable for the fabrication of the major die elements include tool steels, so-called high-speed steels, martensitic steels, precipitation hardening steels, and stainless steels, such as martensitic stainless steels. Exemplary martensitic stainless steels include, but are not limited to, 400 series stainless steels, such as 422 stainless steels and 450 stainless steels, and precipitation hardening stainless steels, such as 17-4 PH stainless steels.

In some embodiments, the method of manufacturing extrusion die 200 is selected or determined at least in part on the designs selected for discharge slots 214 and the die body 204 to be assembled. For example, for the construction of extrusion die 200 shown in FIGS. 2-3, fabrication through a combination of electrical discharge machining (EDM) for the shaped feedhole extensions and wire EDM slotting for forming the slot and pin shapes can be used.

Figure 4:
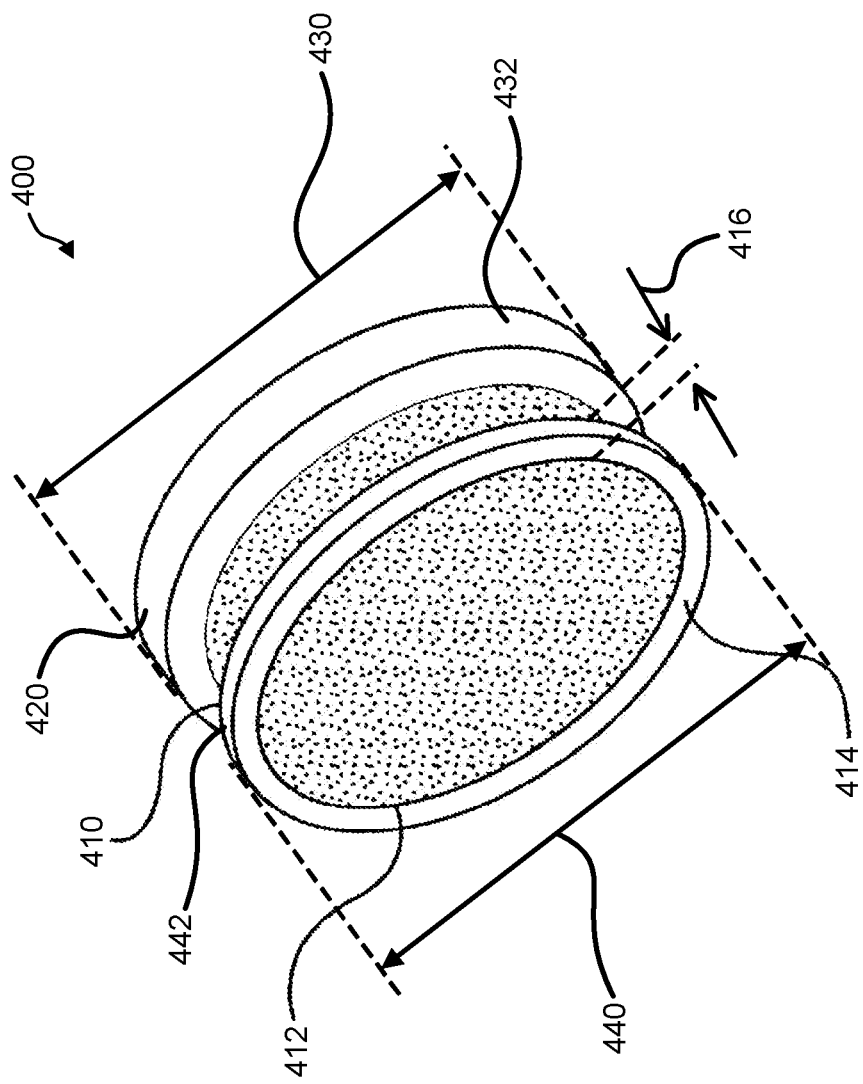
FIG. 4 illustrates an extrusion die and an impedance disk according to some embodiments.

FIG. 4 illustrates an extrusion die and a neutral impedance disk assembly 400 according to some embodiments. Assembly 400 comprises an impedance disk 410 having a perforated central portion 412 and a solid rim portion 414, and an extrusion die 420. Extrusion die 420 can be the same as or similar to extrusion die 200. Impedance disk 410 can be the same as or similar to (including any combination of features and/or components) impedance disk 100.

Impedance disk 410 has a thickness 416. In some the embodiments, thickness 416 is in the range of 0.005 inches to 0.05 inches, including subranges. For example, in some embodiments, thickness 416 is 0.005 inches, 0.006 inches, 0.007 inches, 0.008 inches, 0.009 inches, 0.01 inches, 0.02 inches, 0.03 inches, 0.04 inches, 0.05 inches, or within a range having any two of these values as endpoints. Impedance disk 410 has an effective diameter 440 measured with respect to an outer edge 442.

Extrusion die 420 has an effective diameter 430 measured with respect to an outer edge 432. In some embodiments, effective diameter 430 is in the range of 8 inches to 20 inches, including subranges. For example, effective diameter 430 can be 8 inches, 9 inches, 10 inches, 11 inches, 12 inches, 13 inches, 14 inches, 15 inches, 16 inches, 17 inches, 18 inches, 19 inches, or 20 inches, or an effective diameter within a range having any two of these values as endpoints. In some embodiments, effective diameter 440 of impedance disk 410 is the same as effective diameter 430 of extrusion die 420 (i.e., impedance disk 410 can be a neutral impedance disk).

Figure 5:
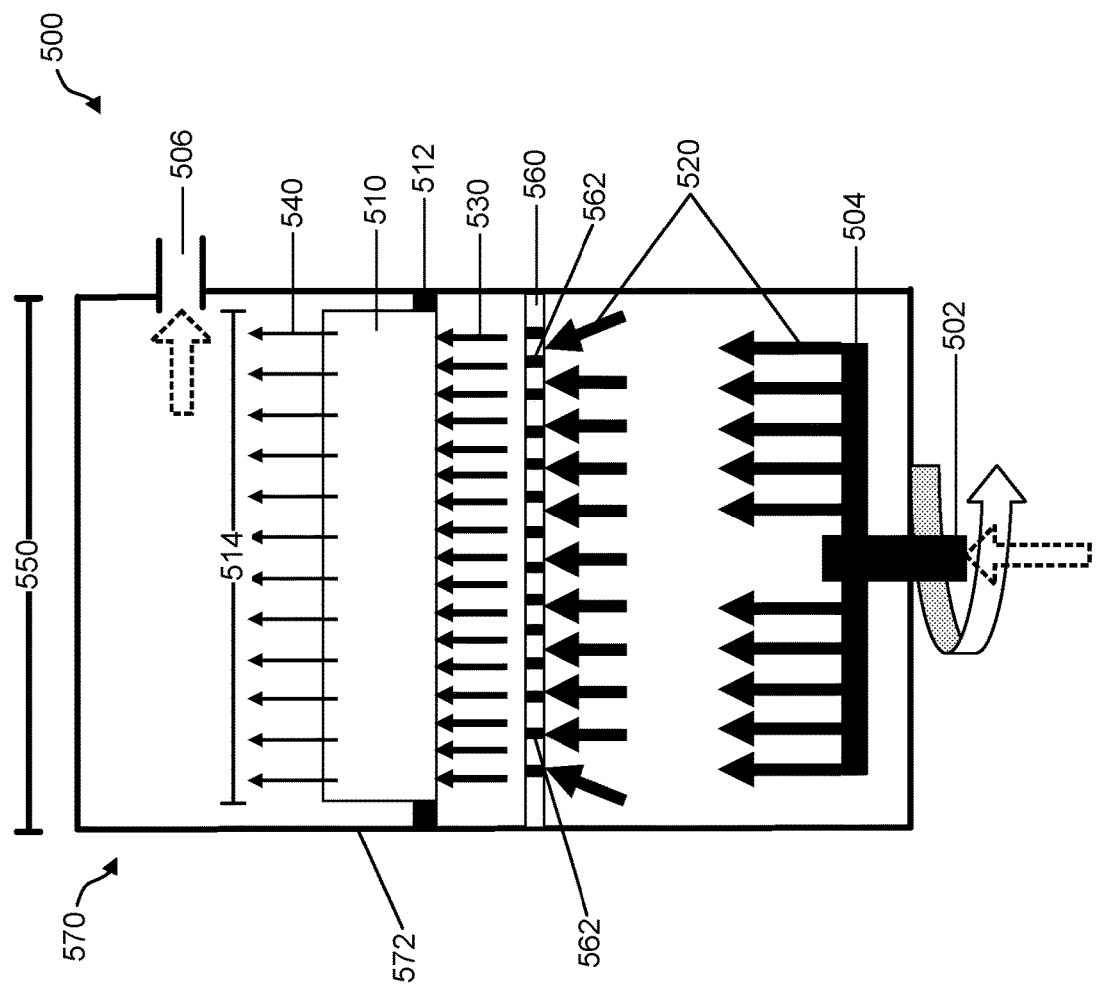
FIG. 5 is a schematic of a vapor deposition system for extrusion die coating according to some embodiments.

FIG. 5 illustrates a schematic of a vapor deposition system 500 for extrusion die coating according to some embodiments. System 500 comprises a vapor deposition chamber 570 having a gas inlet 502 and a gas outlet 506. Disposed within chamber 570 is an extrusion die 510, held by a die holder 512, and an impedance disk 560. Impedance disk 560 can be positioned within chamber 570 over a face of extrusion die 510. Impedance disk 560 has a plurality of through holes 562 and can be the same as or similar to impedance disk 100 or impedance disk 400. Extrusion die 510 can be the same or similar to (e.g., including any combination of features or components) extrusion die 200, and has a plurality of openings extending therethrough (e.g., slots defined by a plurality of extrusion die pins, feedholes, etc.).

System 500 can be chemical vapor deposition system or a physical vapor deposition system. In some embodiments, vapor deposition system 500 comprises a rotary-t 504. During use, one or more deposition gases (e.g., a source gas or a carrier gas) can be flowed from gas inlet 502, through rotary-t 504 and into the inside of chamber 570. In practice, impedance disk 560 is disposed between gas inlet 502 and the face of extrusion die 510 such that one or more deposition gases are flowed from gas inlet 502, through the through holes 562 in impedance disk 560, and into the openings in extrusion die 510 to deposit inorganic particles on side walls or surfaces defining the openings (e.g., the walls defining feedholes or the pins defining slots). In embodiments in which the extrusion 510 resembles the die 200 having both feedholes (e.g., akin to the feedholes 206) and slots (e.g., akin to the slots 214), the die 510 can be oriented in the chamber 570 such that after first flowing through the slots in extrusion die 510, the one or more deposition gases are flowed through the feed holes of extrusion die 510.

When one or more deposition gases enters the chamber 570, the gas(es) have a first gas pressure 520. However, when the gas(es) flow(s) through impedance disk 560, the pressure decreases to a second gas pressure 530 due to the disk impedance of impedance disk 560. Similarly, when the gas(es) travel through the extrusion die 510, the pressure of the gas(es) decreases to a third gas pressure 540 due to the die impedance of extrusion die 510. So, a total change in gas pressure within chamber 570 through impedance disk 560 and extrusion die 510 is equal to first gas pressure 520 minus third gas pressure 540. In some embodiments, the disk impedance of impedance disk 560 is at least 40% of the total flow impedance of the components within chamber 570 (e.g., the impedance disk and the extrusion die). In some embodiments, the disk impedance of impedance disk 560 is at least 50% of the total flow impedance within chamber 570. In some embodiments, the disk impedance of impedance disk 560 is within the range of 40% to 60% of the total impedance to the flow within chamber 570 (i.e., total system impedance), including subranges. For example, in some embodiments, the disk impedance of impedance disk 560 is 40%, 45%, 50%, 55%, or 60% of the total impedance to the flow within chamber 570, or within a range having any two of these values as endpoints.

In some embodiments, the disk impedance of impedance disk 560 is within the range of 65% to 150% of the die impedance of extrusion die 510, including subranges. For example, in some embodiments, the disk impedance of impedance disk 560 is 65%, 70%, 80%, 90%, 100%, 110%, 120%, 130%, 140%, or 150% of the die impedance of extrusion die 510, or within a range having any two of these values as endpoints. In particular, as discussed herein, setting the disk impedance to be approximately equal to or greater than the die impedance can advantageously influence the gas flow field through the deposition chamber (e.g., the disk impedance preferably 80%, 90%, or more, relative to the die impedance), thereby enabling a more even distribution of deposition material across the features of the extrusion die (i.e., reduced coating thickness variability), particularly for dies having effective diameters similar to the effective diameter of the deposition chamber (e.g., within 70% of the effective diameter of the deposition chamber and/or with a spacing of less than about 1-2 inches between the outer perimeter of the die and the interior wall of the deposition chamber).

As shown in FIG. 5, an effective diameter 514 (also shown as effective diameter 430 in FIG. 4) of extrusion die 510 is nearly as large as a minimum internal cross-sectional dimension 550 of chamber 570. As used herein, a "minimum internal cross-sectional dimension" is the smallest internal cross-sectional dimension of a vapor deposition chamber wall (e.g., wall 572 in FIG. 5) measured perpendicular to the intended flow of deposition gas(es) within a chamber and though a region of the chamber intended to house a deposition target (e.g., extrusion die). For the purposes herein, the minimum internal cross-sectional dimension of the vapor deposition chamber also generally corresponds to the dimension of the chamber that results in the smallest gap or space between the outer edge of the extrusion die and the inner wall(s) of the chamber when the die is positioned in the chamber. For example, for a chamber wall with a circular cross-sectional shape, the minimum internal cross-sectional dimension is the effective diameter of the circle. As another example, for a chamber wall with a square cross-sectional shape, the minimum internal cross-sectional dimension is the length or width of the square.

As discussed above, the boundary layer effect may affect the results of a deposition process carried out within the chamber 570 (e.g., may affect the variability of the thickness of the applied coating), particularly where the size (e.g., effective diameter) of the die 510 approaches the minimum internal cross-sectional dimension 550 of the chamber 570. For example, the inventors have identified that boundary layer effects may be present in embodiments in which the outer edge of an extrusion die is positioned less than a few inches (e.g., less than 3 inches) from the inner wall, particularly in embodiments in which the outer edge of the extrusion die is positioned less than 1.5 inches or especially less than 1 inch from the inner wall of the deposition chamber.

In some embodiments, effective diameter 514 of die 510 is at least 70% of minimum internal cross-sectional dimension 550 of chamber 570. In some embodiments, effective diameter 514 of die 510 is at least 75% of the minimum internal cross-sectional dimension 550 of the chamber 570. In some embodiments, effective diameter 514 of die is at least 80% of the minimum internal cross-sectional dimension 550 of chamber 570. In some embodiments, effective diameter 514 of die 510 is at least 85% of the minimum internal cross-sectional dimension 550 of chamber 570. In some embodiments, effective diameter 514 of die is at least 90% of the minimum internal cross-sectional dimension 550 of chamber 570. In some embodiments, effective diameter 514 of die is at least 95% of the minimum internal cross-sectional dimension 550 of chamber 570. As discussed herein, in cases where effective diameter 514 is nearly the same as minimum internal cross-sectional dimension 550 of chamber 570, it is important that the disk impedance of impedance disk 560 is approximately the same, or greater than, the disk impedance (e.g., the disk impedance is at least 40% of the total impedance).

Figure 6:
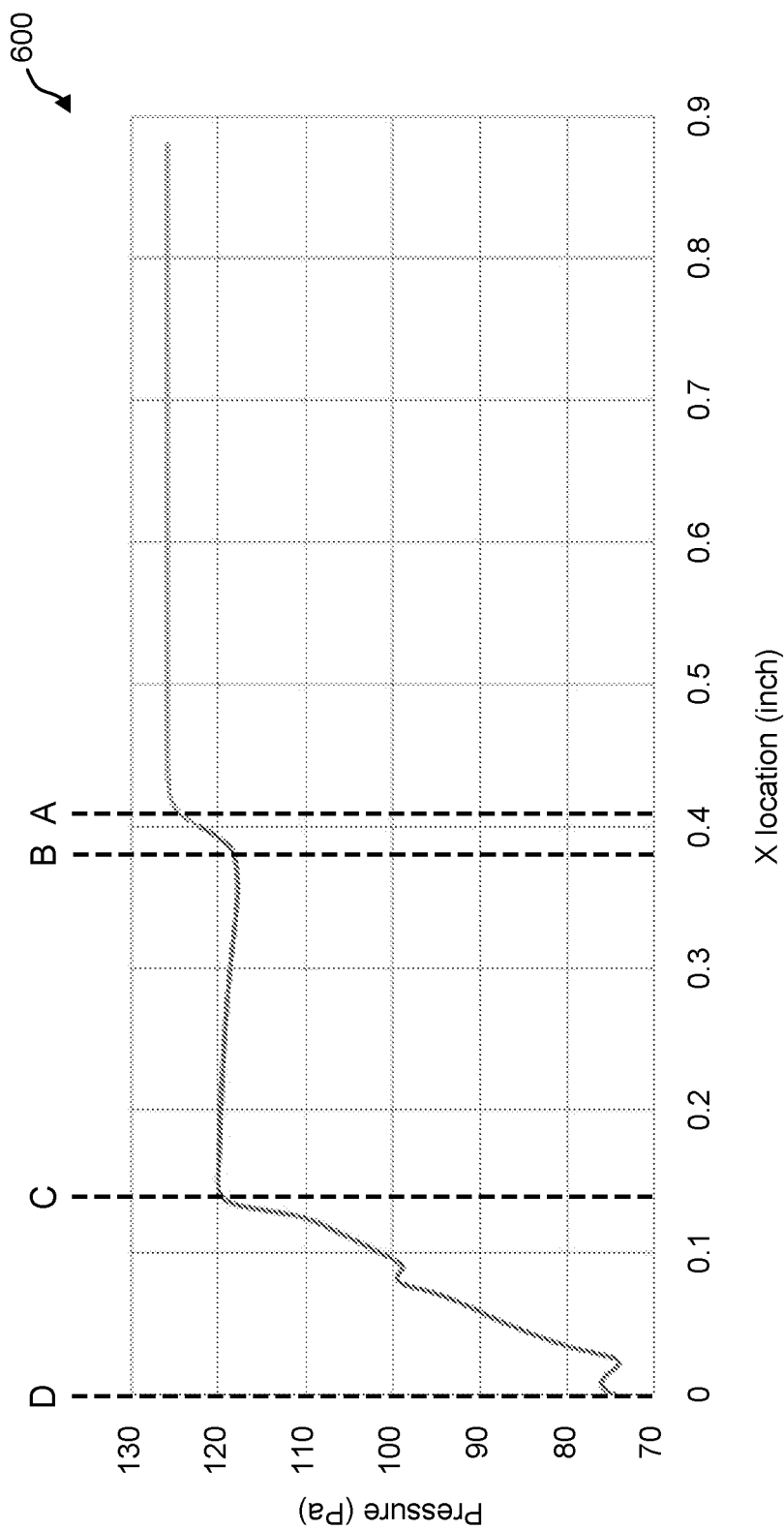
FIG. 6 is a graph showing the change in pressure of a deposition gas within a vapor deposition chamber.

FIG. 6 is a graph 600 modeling the overall pressure change for a deposition gas in an exemplary extrusion die vapor deposition coating system, for example, like system 500 shown in FIG. 5. The lines in FIG. 6 represent the following: line A represents the location at which a deposition gas enters an impedance disk in a modeled vapor deposition chamber; line B represents the location at which the deposition gas leaves the impedance disk in the modeled vapor deposition chamber; line C represents the location at which the deposition gas enters an extrusion die in the modeled vapor deposition chamber; and line D (i.e., X location=zero) represents the location at which the deposition gas leaves overlap regions of the extrusion die in the modeled vapor deposition chamber, for example overlap regions 220 shown in FIG. 2 (any additional pressure drop through feed holes after the overlap regions is considered negligible in the model).

As shown in graph 600, in a vapor deposition system utilizing an impedance disk, the pressure of a deposition gas decreases when it flows through the impedance disk, as shown by the decrease between lines A and B in graph 600. This pressure drop is referred to herein as the disk impedance. Depending on the effective diameter of the extrusion die and the minimum internal cross-sectional dimension of the vapor deposition chamber, this pressure drop may be very low compared to the pressure drop of the deposition gas when it flows through the extrusion die, as shown by the decrease in pressure occurring after line C. This pressure drop is referred to herein as the die impedance. If the dimensions of the die and the chamber are similar, the difference between the disk and die impedances can become problematic because it can result in a deposition coating having an undesirable non-uniform coating thickness on an extrusion die. For example, for extrusion dies having an outer effective diameter similar to the minimum internal cross-sectional chamber dimension of a vapor deposition chamber (e.g., at least 70% of the minimum internal cross-sectional dimension and/or less than about a 1 to 1.5 inch gap between the outer edge of the die and the inner wall of the chamber), the difference between the die and disk impedances is generally large due to the boundary layer effect, which results in the undesirable non-uniform coating thickness.

As described above, the boundary layer effect results in the deposition gas flow field dominating the concentration of one or more deposition gases. For example, instead of the thickness of the coating being consistently controlled by the concentration of the deposition gas(es) in the chamber, the thickness of the coating proximate to the walls of the chamber is also influenced by the boundary layer effect. This is undesirable because it significantly reduces the impact the impedance disk has in controlling deposition of inorganic particles within a vapor deposition chamber, and thus the uniformity of a coating formed by deposition of the inorganic particles.

As also described above, impedance disks as discussed herein can mitigate unwanted variability in the thickness of a coating applied by the deposition process. Impedance disks discussed herein are designed to control the gas flow field such that the disk impedance of the impedance disk is the same or similar to the die impedance of an extrusion die within a vapor deposition chamber. By creating a disk impedance that is similar to a die impedance, (e.g., within 65% to 150% of the die impedance, or more preferably 90% to 150% of the die impedance) substantially uniform flow of one or more deposition gases through an extrusion die can be achieved. In some embodiments, the disk impedance is within the range of 40% to 60% of the total impedance to the flow within a deposition chamber and/or within a range of 65% to 150% of the die impedance, as discussed above. Controlling the disk impedance of an impedance disk can be achieved by tailoring the size of through holes in the impedance disk (e.g., the effective diameter 113 of through holes 112) to obtain a specific disk impedance for a vapor deposition system 500.

Figure 7:
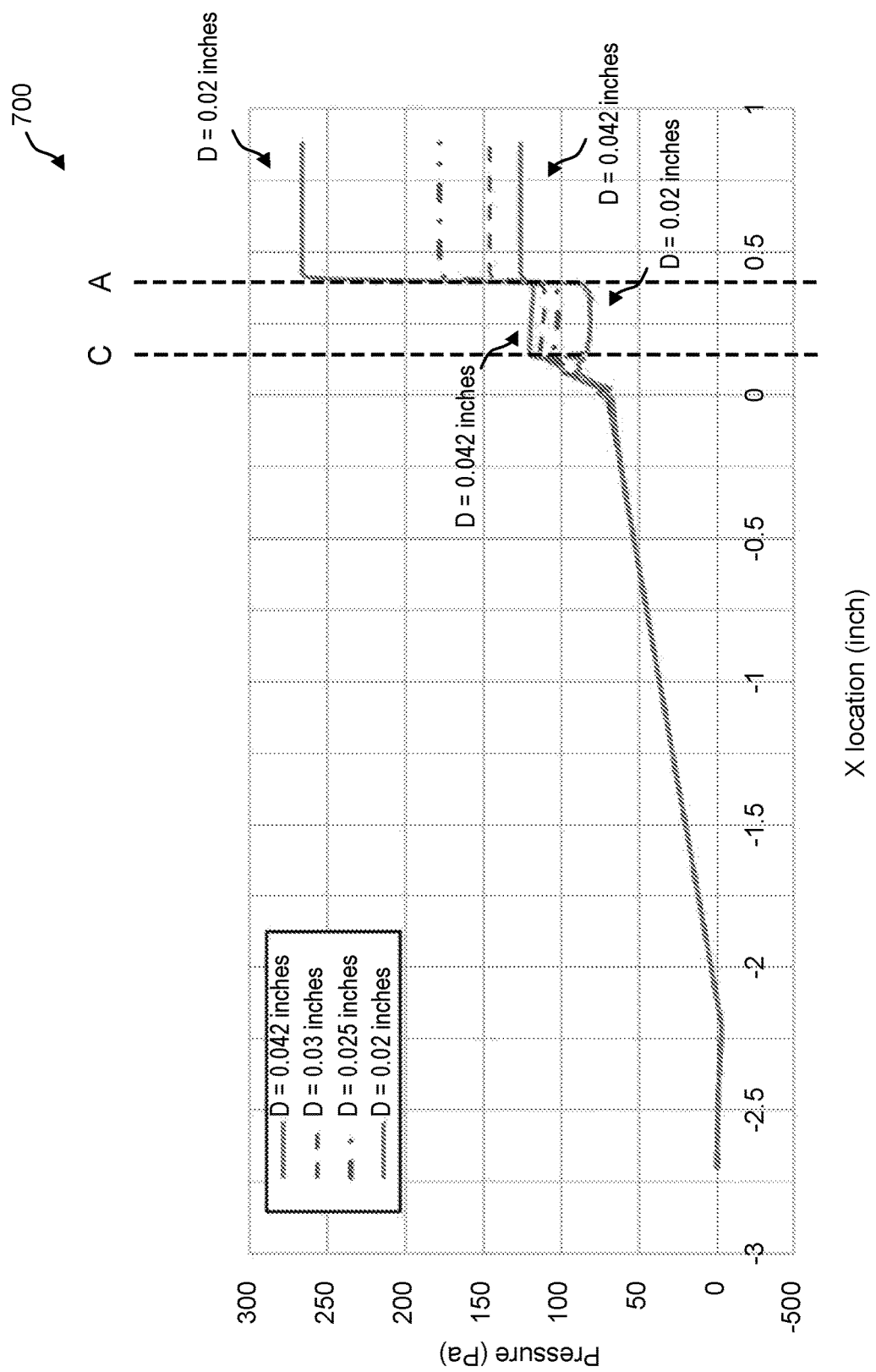
FIG. 7 is a graph showing pressures of a deposition gas for various impedance disks.

Graph 700 in FIG. 7 shows modeled pressure drop distributions for a deposition gas in an extrusion die vapor deposition coating system with impedance disks having varying through hole effective diameters. Like in graph 600, as the deposition gas moves through a vapor deposition chamber, it experiences a first drop in pressure at line A (where it flows through the impedance disk), and then a second drop in pressure at line C (where it flows through the extrusion die). As demonstrated by the modeled results in graph 700, the pressure drop of the deposition gas was smallest for the impedance disk having through holes with an average effective diameter of 0.02 inches, and largest for the impedance disk having through holes with an average effective diameter of 0.042 inches. Accordingly, graph 700 shows that a smaller average hole effective diameter can increase a disk impedance of an impedance disk. Therefore, a smaller average hole effective diameter can increase the percentage that the disk impedance contributes to a total change in pressure for a vapor deposition chamber. This increase in percentage can be utilized to tailor an impedance disk's disk impedance to be similar to the pressure drop of the deposition gas when it flows through an extrusion die within a vapor deposition chamber (i.e., die impedance).

Figure 8:
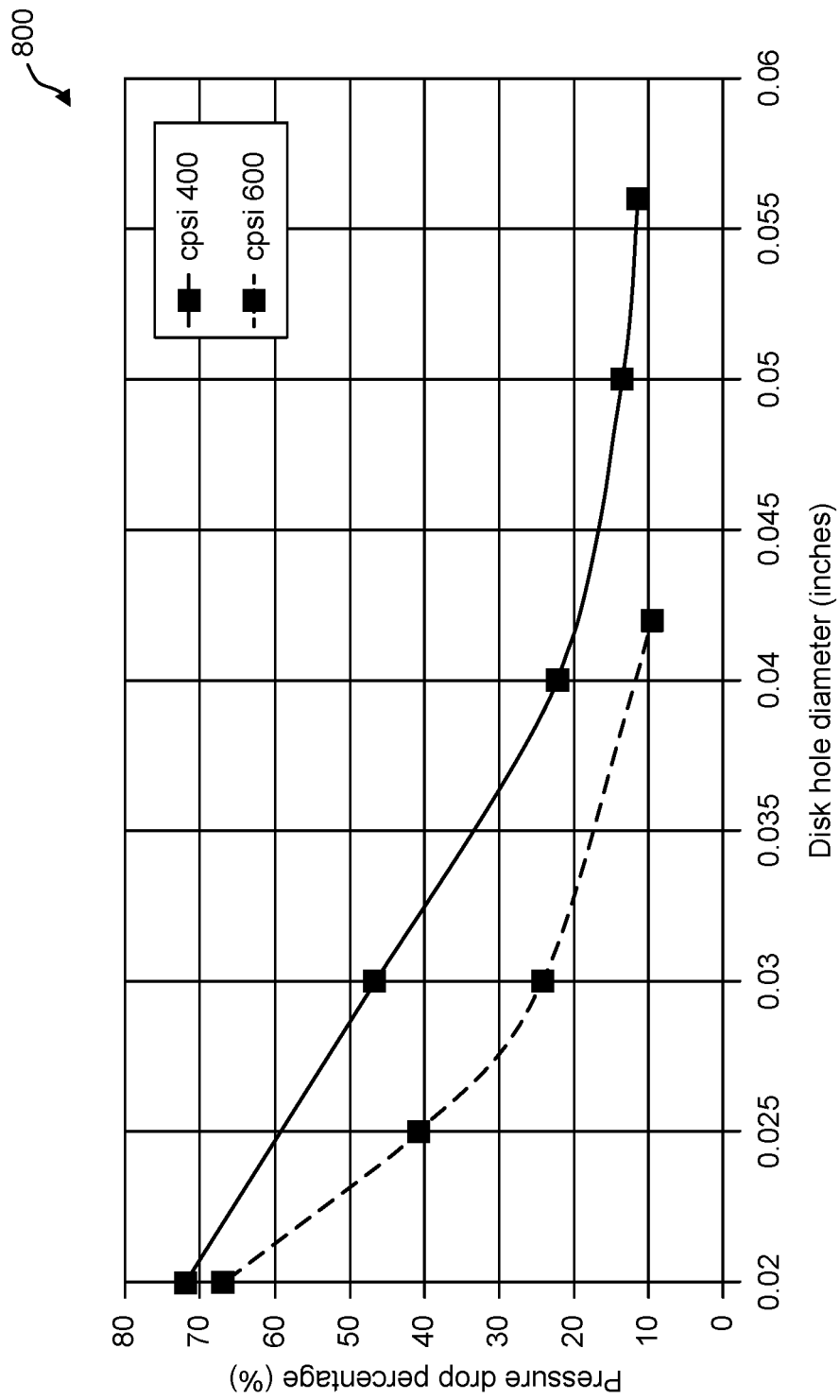
FIG. 8 is a graph showing changes in pressure of a deposition gas for various impedance disks.

FIG. 8 is a graph 800 modeling the disk impedance contribution to the total change in pressure for a vapor deposition chamber versus the impedance disk hole size at a constant gas flow rate (velocity=1.0 m/sec). In graph 800, the "cpsi 600" line shows the pressure drop percentage (disk impedance) for an impedance disk designed for use with an extrusion die that produces a fired ceramic having approximately 600 cells per square inch ("cpsi") and modeled with such an extrusion die. It is noted that since the pins of an extrusion die ultimately form the cells (or channels) of the final honeycomb body, the extrusion die can have approximately 600 pins per square inch. However, due to shrinkage (e.g., up to 15% shrinkage) and sometimes growth (e.g., up to 2% growth) of the honeycomb body after extrusion, e.g., during firing from an extruded green state to a ceramic state, the extrusion die in some embodiments will have a different number of pins per square inch to account for the growth or shrinkage. And the "cpsi 400" line shows the pressure drop percentage (disk impedance) for an impedance disk designed for use with an extrusion die that produces a honeycomb body having approximately 400 cells per square inch ("cpsi") and modeled with such an extrusion die. The difference between the "cpsi 600" impedance disks and the "cpsi 400" impedance disks is the center-to-center lateral spacing of the through holes on these disks, corresponding to placement of the pins and feedholes on the respective "600 cpsi" and "400 cpsi" extrusion dies.

As shown in graph 800, the appropriate through hole effective diameter to achieve a 40% disk impedance contribution for the die corresponding to 600 cpsi is 0.025 inches while the appropriate through hole effective diameter to achieve 40% disk impedance contribution for the die of corresponding to 400 cpsi cell density is about 0.033 inches. The results shown in graph 800 demonstrate that disk impedance can be controlled by tailoring the average hole size and/or center-to-center lateral spacing of through holes for an impedance disk.

Empirical tests performed on the impedance disks modeled in graph 800 have shown that an impedance disk that results in 40% or more of a vapor deposition system's total change in pressure (impedance) may be adequate in controlling the boundary layer effect for any size extrusion die when the boundary layer effect is present in a vapor deposition system, for example due to a relatively large extrusion die in comparison to the size of the deposition chamber.

Figure 9:
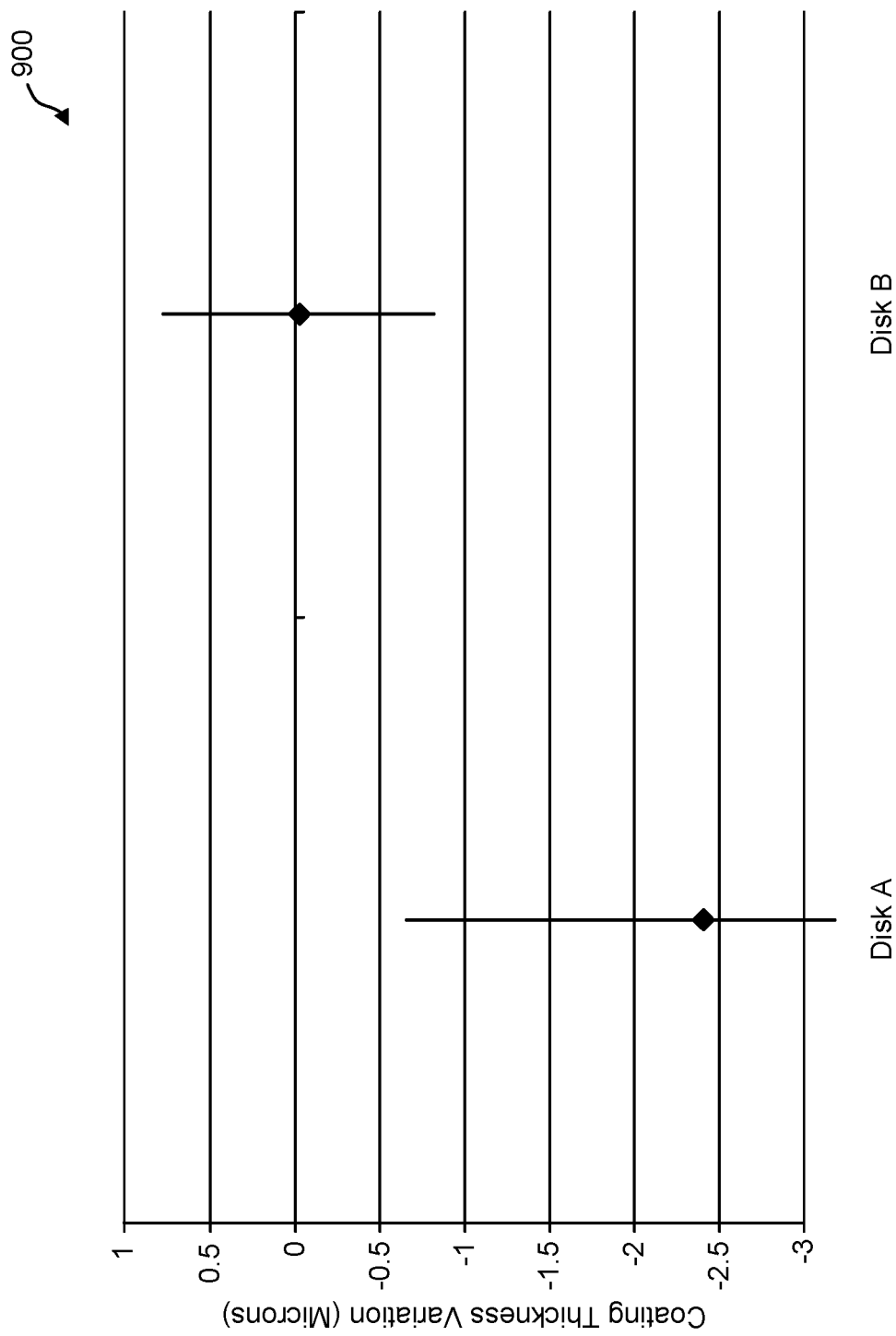
FIG. 9 is a graph showing variation in coating thickness on an extrusion die coated in a vapor deposition chamber with an exemplary impedance disk, and on an extrusion die coated in a vapor deposition chamber with an impedance disk according to some embodiments.

FIG. 9 is a graph 900 showing the average coating thickness variability for extrusion dies coated with inorganic particles. The "disk A" results are for 18 inch extrusion dies coated in a chemical vapor deposition chamber with an impedance disk having a disk impedance less than 40% of the total impedance to the flow of one or more deposition gas used to coat inorganic particles on the extrusion dies. The "disk B" results are for 18 inch extrusion dies coated in a chemical vapor deposition chamber with an impedance disk having a disk impedance more than 40% of the total impedance to the flow of one or more deposition gas used to coat inorganic particles on the extrusion dies. The diameter of the extrusions dies was at least 70% of the minimum internal cross-sectional chamber dimension for both "disk A" and "disk B" results. All the disks tested were neutral impedance disks. The extrusion dies tested were designed to produce a honeycomb body having 600 cpsi. The average coating thickness variability reported in graph 900 is the average change in coating thickness measured from the center of an extrusion die face to the edge of the extrusion die face for at least five measured extrusion dies.

As shown in graph 900, the use of an impedance disk with a higher disk impedance ("disk B") resulted in an average coating thickness variation close to zero (the desired variation level). The results for "disk A" showed an average coating thickness variation of about −2.4 microns (micrometers, μm) with a standard deviation of 4.8 microns. This means the average coating thickness decreased by about 2.4 microns when moving toward the edge of the extrusion dies tested. The results for "disk B" showed an average coating thickness variation of about −0.03 inches with a standard deviation of 1.5 microns. This means that the average coating thickness decreased by about 0.03 microns when moving toward the edge of the extrusion dies tested. Accordingly, an impedance disk having a disk impedance of at least 40% of the total impedance to the flow of a vapor deposition system significantly reduces the coating thickness variation and thus significantly reduces slot width variability. Similar results were achieved with extrusion dies designed to produced honeycomb bodies having 400 cpsi.

While various embodiments have been described herein, they have been presented by way of example, and not limitation. It should be apparent that adaptations and modifications are intended to be within the meaning and range of equivalents of the disclosed embodiments, based on the teaching and guidance presented herein. It therefore will be apparent to one skilled in the art that various changes in form and detail can be made to the embodiments disclosed herein without departing from the spirit and scope of the present disclosure. The elements of the embodiments presented herein are not necessarily mutually exclusive, but can be interchanged to meet various situations as would be appreciated by one of skill in the art.

Embodiments of the present disclosure are described in detail herein with reference to embodiments thereof as illustrated in the accompanying drawings, in which like reference numerals are used to indicate identical or functionally similar elements. References to "one embodiment," "an embodiment," "some embodiments," "in certain embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The examples are illustrative, but not limiting, of the present disclosure. Other suitable modifications and adaptations of the variety of conditions and parameters normally encountered in the field, and which would be apparent to those skilled in the art, are within the spirit and scope of the disclosure.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range.

Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. Finally, when the term "about" is used in describing a value or an end-point of a range, the disclosure should be understood to include the specific value or end-point referred to. If a numerical value or end-point of a range recites "about," the numerical value or end-point of a range is intended to be taught, i.e., to include that value or end-point not modified by "about".

The present embodiment(s) have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It is to be understood that the phraseology or terminology used herein is for the purpose of description and not of limitation. The breadth and scope of the present disclosure should not be limited by any of the above-described exemplary embodiments, but should be defined in accordance with the following claims and their equivalents.

What is claimed is:

1. A method of depositing an inorganic material on an extrusion die comprising a face comprising a plurality of slots and a plurality of extrusion die pins, the method comprising:
    flowing one or more deposition gases into a vapor deposition chamber of a vapor deposition system, such that the gases travel through a plurality of through holes in an impedance disk disposed in the vapor deposition chamber, then the gases travel through the extrusion die disposed in the vapor deposition chamber, and into the plurality of slots to deposit inorganic particles on side walls of the plurality of pins, wherein a total impedance to the flow of the one or more deposition gases across the impedance disk and the extrusion die is equal to a disk impedance of the impedance disk plus a die impedance of the extrusion die, wherein the through holes comprise an average effective diameter, wherein the average effective diameter of the through holes sets the disk impedance to be at least 40% of the total impedance to the flow of the one or more deposition gases across the impedance disk and the extrusion die, and wherein the disk impedance is at least 40% of the total impedance to the flow of the one or more deposition gases.

2. The method of claim 1, wherein the disk impedance is at least 50% of the total impedance to the flow of the one or more deposition gases.

3. The method of claim 1, wherein the disk impedance is 40% to 60% of the total impedance to the flow of the one or more deposition gases.

4. The method of claim 1, wherein the disk impedance is 65% to 150% of the die impedance.

5. The method of claim 1, wherein the disk impedance is 90% to 150% of the die impedance.

6. The method of claim 1, wherein the vapor deposition chamber comprises an inlet that supplies the one or more deposition gases to the vapor deposition chamber, wherein the impedance disk is disposed between the inlet and the face of the extrusion die.

7. The method of claim 1, wherein the extrusion die further comprises a plurality of feed holes, and wherein the pins of the extrusion die are disposed between the feed holes and the impedance disk.

8. The method of claim 1, wherein the through holes comprise a center-to-center lateral spacing and the feed holes comprise a center-to-center lateral spacing, and wherein a value of the center-to-center lateral spacing of the through holes is within 60% of that of the center-to-center-lateral spacing of the feed holes.

9. The method of claim 1, wherein the through holes comprise a center-to-center lateral spacing and the feed holes comprise a center-to-center lateral spacing, and wherein the center-to-center lateral spacing of the through holes is within 10% of the center-to-center lateral spacing of the feed holes.

10. The method of claim 1, wherein the vapor deposition chamber comprises a chamber wall surrounding the extrusion die, and wherein the chamber wall comprises a minimum internal cross-sectional dimension measured perpendicular to the flow of the one or more deposition gases within the vapor deposition chamber, and wherein the extrusion die comprises an effective diameter equal to at least 70% of the minimum internal cross-sectional chamber dimension.

11. The method of claim 1, wherein the inorganic particles comprise at least one of: boron-doped titanium carbonitride, titanium carbonitride, or titanium nitride.

12. The method of claim 1, wherein the extrusion die comprises stainless steel.

13. The method of claim 1, wherein the extrusion die comprises a honeycomb geometry.

14. The method of claim 1, wherein the vapor deposition chamber is a chemical vapor deposition chamber.

15. A method of depositing an inorganic material on an extrusion die comprising a plurality of feed holes and a face comprising a plurality of slots defined by a plurality of extrusion die pins, the method comprising:

flowing one or more deposition gases into a vapor deposition chamber of a vapor deposition system, such that the gases travel through a plurality of through holes of an impedance disk located in the vapor deposition chamber, then the gases travel through the extrusion die disposed in the vapor deposition chamber, and into the plurality of slots to deposit inorganic particles on side walls of the plurality of pins, wherein an effective diameter of the extrusion die is at least 70% of a minimum internal cross-sectional chamber dimension of the vapor deposition chamber, wherein the through holes comprise a center-to-center lateral spacing, the feed holes comprise a center-to-center lateral spacing, and the center-to-center lateral spacing of the through holes is within 10% of the center-to-center lateral spacing of the feed holes, and wherein a total impedance to the flow of the one or more deposition gases across the impedance disk and the extrusion die is equal to a disk impedance of the impedance disk plus a die impedance of the extrusion die, and the disk impedance is at least 40% of the total impedance to the flow of the one or more deposition gases.

16. The method of claim 15, wherein the extrusion die comprises a honeycomb geometry.

17. A method of depositing an inorganic material on an extrusion die comprising a face comprising a plurality of slots and a plurality of extrusion die pins, the method comprising:

flowing one or more deposition gases into a vapor deposition chamber of a vapor deposition system, such that the gases travel through a plurality of through holes in an impedance disk disposed in the vapor deposition chamber, then the gases travel through the extrusion die disposed in the vapor deposition chamber, and into the plurality of slots to deposit inorganic particles on side walls of the plurality of pins, wherein a total impedance to the flow of the one or more deposition gases across the impedance disk and the extrusion die is equal to a disk impedance of the impedance disk plus a die impedance of the extrusion die, wherein the through holes comprise a center-to-center lateral spacing and the feed holes comprise a center-to-center lateral spacing, and wherein a value of the center-to-center lateral spacing of the through holes is within 60% of that of the center-to-center-lateral spacing of the feed holes, and wherein the disk impedance is at least 40% of the total impedance to the flow of the one or more deposition gases.

18. A method of depositing an inorganic material on an extrusion die comprising a face comprising a plurality of slots and a plurality of extrusion die pins, the method comprising:

flowing one or more deposition gases into a vapor deposition chamber of a vapor deposition system, such that the gases travel through a plurality of through holes in an impedance disk disposed in the vapor deposition chamber, then the gases travel through the extrusion die disposed in the vapor deposition chamber, and into the plurality of slots to deposit inorganic particles on side walls of the plurality of pins, wherein a total impedance to the flow of the one or more deposition gases across the impedance disk and the extrusion die is equal to a disk impedance of the impedance disk plus a die impedance of the extrusion die, wherein the through holes comprise a center-to-center lateral spacing and the feed holes comprise a center-to-center lateral spacing, wherein the center-to-center lateral spacing of the through holes is within 10% of the center-to-center lateral spacing of the feed holes, and wherein the disk impedance is at least 40% of the total impedance to the flow of the one or more deposition gases.

19. A method of depositing an inorganic material on an extrusion die comprising a face comprising a plurality of slots and a plurality of extrusion die pins, the method comprising:

flowing one or more deposition gases into a vapor deposition chamber of a vapor deposition system, such that the gases travel through a plurality of through holes in an impedance disk disposed in the vapor deposition chamber, then the gases travel through the extrusion die disposed in the vapor deposition chamber, and into the plurality of slots to deposit inorganic particles on side walls of the plurality of pins, wherein a total impedance to the flow of the one or more deposition gases across the impedance disk and the extrusion die is equal to a disk impedance of the impedance disk plus a die impedance of the extrusion die, wherein the vapor deposition chamber comprises a chamber wall surrounding the extrusion die, and wherein the chamber wall comprises a minimum internal cross-sectional dimension measured perpendicular to the flow of the one or more deposition gases within the vapor deposition chamber, and wherein the extrusion die comprises an effective diameter equal to at least 70% of the minimum internal cross-sectional chamber dimension, and wherein the disk impedance is at least 40% of the total impedance to the flow of the one or more deposition gases.

* * * * *